United States Patent
Matsumoto et al.

(10) Patent No.: US 7,692,441 B2
(45) Date of Patent: Apr. 6, 2010

(54) TEST APPARATUS AND PIN ELECTRONICS CARD

(75) Inventors: Naoki Matsumoto, Tokyo (JP); Takashi Sekino, Tokyo (JP)

(73) Assignee: Advantest Corporation, Tokyo (JP)

( * ) Notice: Subject to any disclaimer, the term of this patent is extended or adjusted under 35 U.S.C. 154(b) by 115 days.

(21) Appl. No.: 12/136,049

(22) Filed: Jun. 10, 2008

(65) Prior Publication Data
US 2009/0146677 A1   Jun. 11, 2009

Related U.S. Application Data

(63) Continuation of application No. PCT/JP2006/324847, filed on Dec. 13, 2006.

(30) Foreign Application Priority Data

Dec. 15, 2005  (JP) .............................. 2005-361919

(51) Int. Cl.
*G01R 31/26* (2006.01)
(52) U.S. Cl. ..................... 324/765; 324/76.11; 324/73.1
(58) Field of Classification Search ................ 324/523, 324/527–528, 763–765, 549, 667, 672, 705, 324/713, 76.11; 323/277–282, 315
See application file for complete search history.

(56) References Cited

U.S. PATENT DOCUMENTS 4,176,313 A * 11/1979 Wrinn ........................ 324/705
5,351,010 A *  9/1994 Leopold et al. ............. 324/704

FOREIGN PATENT DOCUMENTS

| JP | 61044372   | 3/1986 |
| JP | 2001074816 | 3/2001 |
| JP | 2002107406 | 4/2002 |

* cited by examiner

*Primary Examiner*—Minh N Tang
*Assistant Examiner*—Trung Q Nguyen
(74) *Attorney, Agent, or Firm*—Jianq Chyun IP Office

(57) ABSTRACT

There is provided a test apparatus including a driver that outputs a test signal to a device under test, a first switch that switches whether to connect the driver to the device under test, a comparator that receives an output signal from the device under test via the first switch, and compares a voltage of the output signal with a predetermined reference voltage, a reference voltage input section that inputs the reference voltage into the comparator, a second switch that is provided between the reference voltage input section and the comparator, and a dummy resistance that is connected at one end thereof to a connection point between the comparator and the second switch and at the other end thereof to a predetermined potential. Here, a resistance ratio between an output resistance of the driver and an on-resistance of the first switch is substantially equal to a resistance ratio between the dummy resistance and an on-resistance of the second switch.

8 Claims, 4 Drawing Sheets

TEST APPARATUS AND PIN ELECTRONICS CARD

CROSS REFERENCE TO RELATED APPLICATION

This is a continuation application of PCT/JP2006/324847 filed on Dec. 13, 2006 which claims priority from a Japanese Patent Application NO. 2005-361919 filed on Dec. 15, 2005, the contents of which are incorporated herein by reference.

BACKGROUND

1. Technical Field

The present invention relates to a test apparatus and a pin electronics card. More particularly, the present invention relates to a test apparatus for testing a device under test such as a semiconductor circuit, and to a pin electronics card for use in the test apparatus.

2. Related Art

A known test apparatus for testing a device under test such as a semiconductor circuit includes a pin electronics card that transmits/receives a signal to/from the device under test. The pin electronics card is provided between the main portion of the test apparatus and the device under test. The pin electronics card inputs a test signal supplied from the test apparatus into the device under test, and receives an output signal from the device under test.

FIG. 4 illustrates an exemplary configuration of a conventional pin electronics card 300. The pin electronics card 300 includes a driver 302, a comparator 304, an FET switch 312, a transmission path 314, and a reference voltage input section 316.

The driver 302 receives a test signal from the main portion of a test apparatus, and inputs the received test signal into a device under test, which is shown as a DUT in FIG. 4. The driver 302 is connected to the device under test through the FET switch 312 and the transmission path 314. The driver 302 includes a level switch 306, an enabling switch 308, and an output resistance 310.

The comparator 304 receives an output signal from the device under test, and compares the signal level of the received output signal with a supplied reference voltage. The comparator 304 is connected to the device under test through the FET switch 312 and the transmission path 314. The reference voltage input section 316 generates a predetermined reference voltage, and inputs the generated reference voltage into the comparator 304.

The FET switch 312 is turned on/off by a supplied gate voltage. The FET switch 312 switches whether to connect the driver 302 and the comparator 304 to the device under test. With the above-described configuration, the pin electronics card 300 exchanges a signal between the main portion of the test apparatus and the device under test. No related references including patent documents have been recognized, and therefore such references are not mentioned here.

While being turned on, the FET switch 312 is represented as an equivalent circuit formed by a resistance that is provided in series between the driver 302 and the device under test, and capacitance components that are respectively provided between the ground potential and the ends of the resistance. The equivalent circuit has a constant RC product, and thus can not realize a low resistance and a low capacitance at the same time.

When having a low on-resistance, the FET switch 312 has a high capacitance while remaining turned on. In this case, the FET switch 312 can not pass a high-frequency signal. This makes it difficult to perform a test by using a high-frequency signal.

For this reason, the on-resistance of the FET switch 312 may be increased to allow a test based on a high-frequency signal. Here, however, it should be noted that the comparator 304 is connected to the device under test via the FET switch 312. Therefore, the on-resistance of the FET switch 312 affects the voltage comparing operation of the comparator 304 when the driver 302 is enabled.

For example, the signal level of the output signal input into the comparator 304 is divided by the output resistance 310 and the on-resistance of the FET switch 312. As the on-resistance of the FET switch 312 increases, the variation of the on-resistance increases. Therefore, a high on-resistance of the FET switch 312 lowers the accuracy of the voltage comparing operation by the comparator 304.

The on-resistance of the FET switch 312 changes in accordance with parameters including the temperature, the source-gate voltage, and the back-gate voltage. Here, the on-resistance of the FET switch 312 changes due to such parameters more significantly when set at a high value. Therefore, a high on-resistance of the FET switch 312 further degrades the accuracy of the voltage comparing operation of the comparator 304.

SUMMARY

An advantage of some aspects of the innovations herein is to provide a test apparatus and a pin electronics card which are capable of solving the above-mentioned problems. This advantage is achieved by combining the features recited in the independent claims. The dependent claims define further effective specific example of the present invention.

According to the first aspect related to the innovations herein, one exemplary test apparatus may include a test apparatus for testing a device under test. The test apparatus includes a driver that outputs a test signal to the device under test, a first switch that switches whether to connect the driver to the device under test, a comparator that receives an output signal from the device under test via the first switch, and compares a voltage of the output signal with a predetermined reference voltage, a reference voltage input section that inputs the reference voltage into the comparator, a second switch that is provided between the reference voltage input section and the comparator, and a dummy resistance that is connected at one end thereof to a connection point between the comparator and the second switch and at the other end thereof to a predetermined potential. Here, a resistance ratio between an output resistance of the driver and an on-resistance of the first switch is substantially equal to a resistance ratio between the dummy resistance and an on-resistance of the second switch.

According to the second aspect related to the innovations herein, one exemplary pin electronics card may include a pin electronics card for use in a test apparatus that tests a device under test, where the pin electronics card transmits/receives a signal to/from the device under test. The pin electronics card includes a driver that outputs a test signal to the device under test, a first switch that switches whether to connect the driver to the device under test, a comparator that receives an output signal from the device under test via the first switch, and compares a voltage of the output signal with a predetermined reference voltage, a reference voltage input section that inputs the reference voltage into the comparator, a second switch that is provided between the reference voltage input section and the comparator, and a dummy resistance that is provided in parallel with the second switch when seen from the comparator. Here, a resistance ratio between an output resistance of the driver and an on-resistance of the first switch is substantially equal to a resistance ratio between the dummy resistance and an on-resistance of the second switch.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 3 illustrates, as an example, an equivalent circuit which is realized when a first FET switch 38 is turned on.

DESCRIPTION OF EXEMPLARY EMBODIMENTS

Hereinafter, an embodiment of the present invention will be described. The embodiment does not limit the invention according to the claims, and all the combinations of the features described in the embodiment are not necessarily essential to means provided by aspects of the invention.

Figure 1:
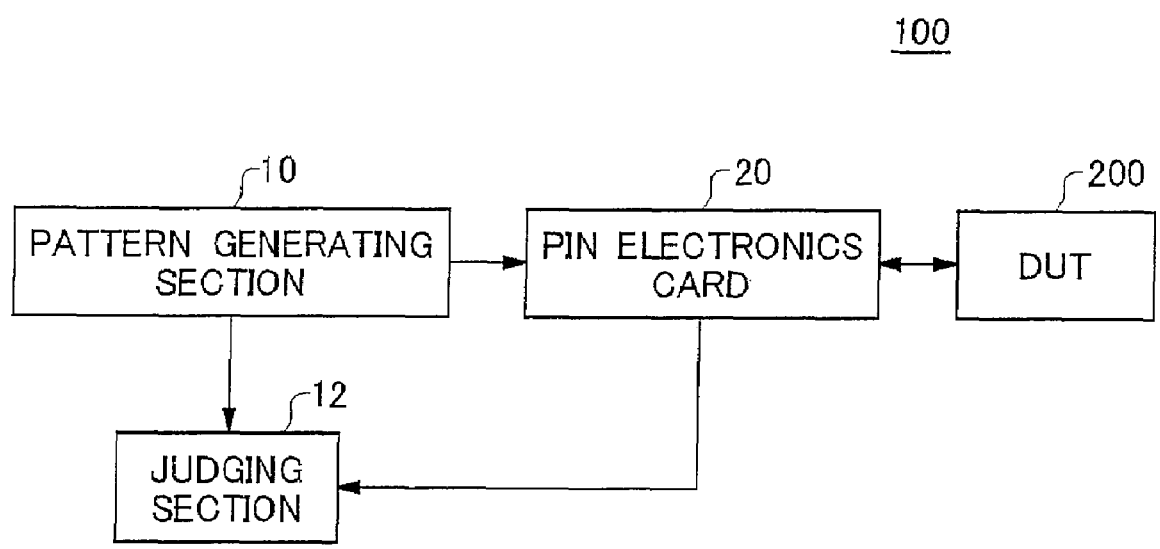
FIG. 1 illustrates an exemplary configuration of a test apparatus 100 relating to an embodiment of the present invention.

FIG. 1 illustrates an exemplary configuration of a test apparatus 100 relating to an embodiment of the present invention. The test apparatus 100 tests a device under test 200 such as a semiconductor circuit. The test apparatus 100 includes a pattern generating section 10, a pin electronics card 20, and a judging section 12.

The pattern generating section 10 generates a test pattern used to test the device under test 200, and inputs the generated test pattern into the pin electronics card 20. Also, the pattern generating section 10 generates an expected value signal which is expected to be output from the device under test 200, and inputs the expected value signal into the judging section 12.

The pin electronics card 20 is provided between the pattern generating section 10 and the device under test 200. The pin electronics card 20 inputs into the device under test 200 a test signal corresponding to the test pattern supplied from the pattern generating section 10, and receives an output signal from the device under test 200.

The judging section 12 receives the output signal from the device under test 200 via the pin electronics card 20. The judging section 12 compares the received output signal with the expected value signal in order to judge whether the device under test 200 is acceptable.

Figure 2:
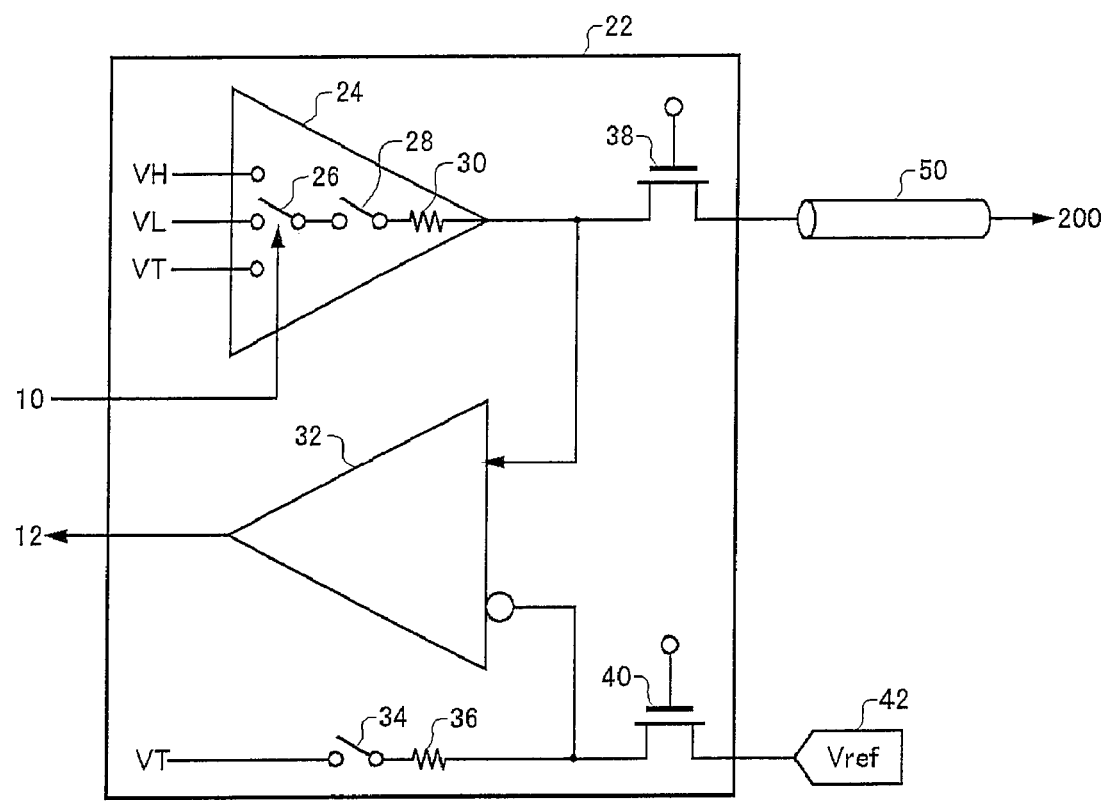
FIG. 2 illustrates an exemplary configuration of a pin electronics card 20.

FIG. 2 illustrates an exemplary configuration of the pin electronics card 20. The pin electronics card 20 includes a substrate 22, a driver 24, a comparator 32, a first FET switch 38, a second FET switch 40, a second enabling switch 34, a dummy resistance 36, a transmission path 50, and a reference voltage input section 42. On the substrate 22, at least the driver 24, the comparator 32, the first FET switch 38, the second FET switch 40, the dummy resistance 36, and the second enabling switch 34 are provided. In other words, the driver 24, the comparator 32, the first FET switch 38, the second FET switch 40, the dummy resistance 36, and the second enabling switch 34 are provided on the same substrate 22.

The driver 24 receives the test pattern from the pattern generating section 10, and outputs to the device under test 200 the test signal corresponding to the received test pattern. According to the present embodiment, the driver 24 includes a level switch 26, a first enabling switch 28 and an output resistance 30.

The level switch 26 selects one of the supplied voltages. According to the present embodiment, the driver 24 is supplied with a voltage VH representing the high level, a voltage VL representing the low level, and a termination voltage VT. When the driver 24 outputs the test signal, the level switch 26 selects one of the voltages VH and VL. For example, the driver 24 can generate the waveform of the test signal corresponding to the test pattern, by selecting one of the voltages VH and VL in accordance with the test pattern and connecting the level switch 26 to the selected voltage.

When the comparator 32 detects the output signal, the level switch 26 is connected to the termination voltage VT. In this case, by controlling the first enabling switch 28, the driver 24 can switch whether to connect the output resistance 30 to the termination voltage VT or terminate the output resistance 30 in a high-impedance manner.

The first FET switch 38 is provided between the driver 24 and the device under test 200. The first FET switch 38 switches whether to connect the driver 24 to the device under test 200. The first FET switch 38 is a field effect transistor, for example, and is turned on/off by the voltage supplied to its gate terminal. Here, the test apparatus 100 may further include a control section that controls the gate voltage of the first FET switch 38.

The comparator 32 has two input terminals, and compares the voltage levels of the signals input into the respective input terminals with each other. According to the present embodiment, a first input terminal of the comparator 32 receives the output signal from the device under test 200 via the first FET switch 38, and a second input terminal receives the reference voltage via the second FET switch 40.

Which is to say, the comparator 32 compares the voltage of the output signal with the predetermined reference voltage. For example, when the voltage level of the output signal is higher than the reference voltage, the comparator 32 outputs a signal showing the H logic. When the voltage level of the output signal is lower than the reference voltage, the comparator 32 outputs a signal showing the L logic. The judging section 12 compares the pattern of the signal output from the comparator 32 with the expected value pattern supplied from the pattern generating section 10.

The reference voltage input section 42 generates the predetermined reference voltage, and inputs the generated reference voltage into the comparator 32. The reference voltage input section 42 may be a digital-to-analog converter that outputs a voltage corresponding to a supplied digital value.

The second FET switch 40 is provided between the comparator 32 and the reference voltage input section 42. The second FET switch 40 switches whether to connect the comparator 32 to the reference voltage input section 42. The second FET switch 40 is a field effect transistor, for example, and is turned on/off by the voltage supplied to its gate terminal. The test apparatus 100 may further include the control section that controls the gate voltage of the first FET switch 38. The control section may turn on/off the first and second FET switches 38 and 40 substantially concurrently.

The dummy resistance 36 is connected at its one end to the connection point between the comparator 32 and the second FET switch 40 and at its other end to a predetermined potential. The other end of the dummy resistance 36 is connected to the termination voltage VT via the second enabling switch 34. When the second enabling switch 34 is turned on, the dummy resistance 36 is connected to the termination voltage VT. When the second enabling switch 34 is turned off, the dummy resistance 36 is terminated in a high-impedance manner.

When the first enabling switch 28 connects the output resistance 30 to the termination voltage VT, the second enabling switch 34 connects the dummy resistance 36 to the termination voltage VT. When the first enabling switch 28 terminates the output resistance 30 in a high-impedance manner, the second enabling switch 34 terminates the dummy resistance 36 in a high-impedance manner.

When the output resistance 30 and the dummy resistance 36 are terminated in a high-impedance manner, the comparator 32 has very high input impedance. Therefore, the first and second FET switches 38 and 40 do not cause a voltage drop respectively in the output signal and the reference voltage. Consequently, the voltage levels of the output signal and the reference voltage which are input into the comparator 32 do not vary even when the on-resistances of the first and second FET switches 38 and 40 vary due to the variation factors such as the temperature. For the reasons stated above, the present embodiment prevents degradation in the accuracy of the voltage comparing operation of the comparator 32.

On the other hand, when the output resistance 30 and the dummy resistance 36 are connected to the termination voltage VT, the voltage of the output signal and the reference voltage which are input into the comparator 32 are respectively divided in accordance with the voltage dividing ratio defined by the output resistance 30 and the first FET switch 38 and the voltage dividing ratio defined by the dummy resistance 36 and the second FET switch 40. According to the present embodiment, the output resistance 30, the first FET switch 38, the dummy resistance 36, and the second FET switch 40 are formed on the substrate 22 in such a manner that the resistance ratio between the output resistance 30 of the driver 24 and the on-resistance of the first FET switch 38 is substantially equal to the resistance ratio between the dummy resistance 36 and the on-resistance of the second FET switch 40. In this manner, the voltage dividing ratio defined by the output resistance 30 and the first FET switch 38 becomes substantially equal to the voltage dividing ratio defined by the dummy resistance 36 and the second FET switch 40.

Here, the output resistance 30, the first FET switch 38, the dummy resistance 36, and the second FET switch 40 are formed on the same substrate 22. Therefore, when the voltage dividing ratio defined by the output resistance 30 and the first FET switch 38 varies due to variation factors such as the temperature, the voltage dividing ratio defined by the dummy resistance 36 and the second FET switch 40 varies by substantially the same amount due to the variation factors. Which is to say, when the on-resistances of the FET switches and other variables vary due to some variation factors such as the temperature, the voltage of the output signal and the reference voltage which are input into the comparator 32 both vary by substantially the same amount. For the reasons stated above, when the output resistance 30 and the dummy resistance 36 are connected to the termination voltage VT, the present embodiment can also prevent degradation in the accuracy of the voltage comparing operation of the comparator 32.

As described in the above, the pin electronics card 20 relating to the present embodiment can prevent the resistance value of the on-resistance of the first FET switch 38 from degrading the accuracy of the voltage comparing operation of the comparator 32. As a result, the test apparatus 100 relating to the present embodiment can perform an accurate test even when the first FET switch 38 has a high on-resistance so as to be capable of transmitting a high-frequency signal.

Figure 3:
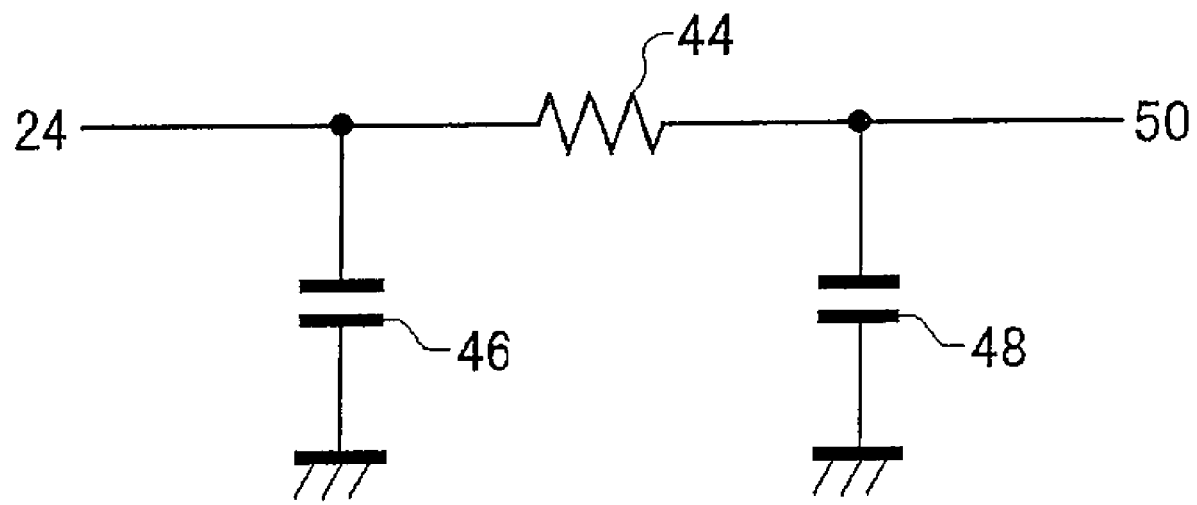
Figure 4:
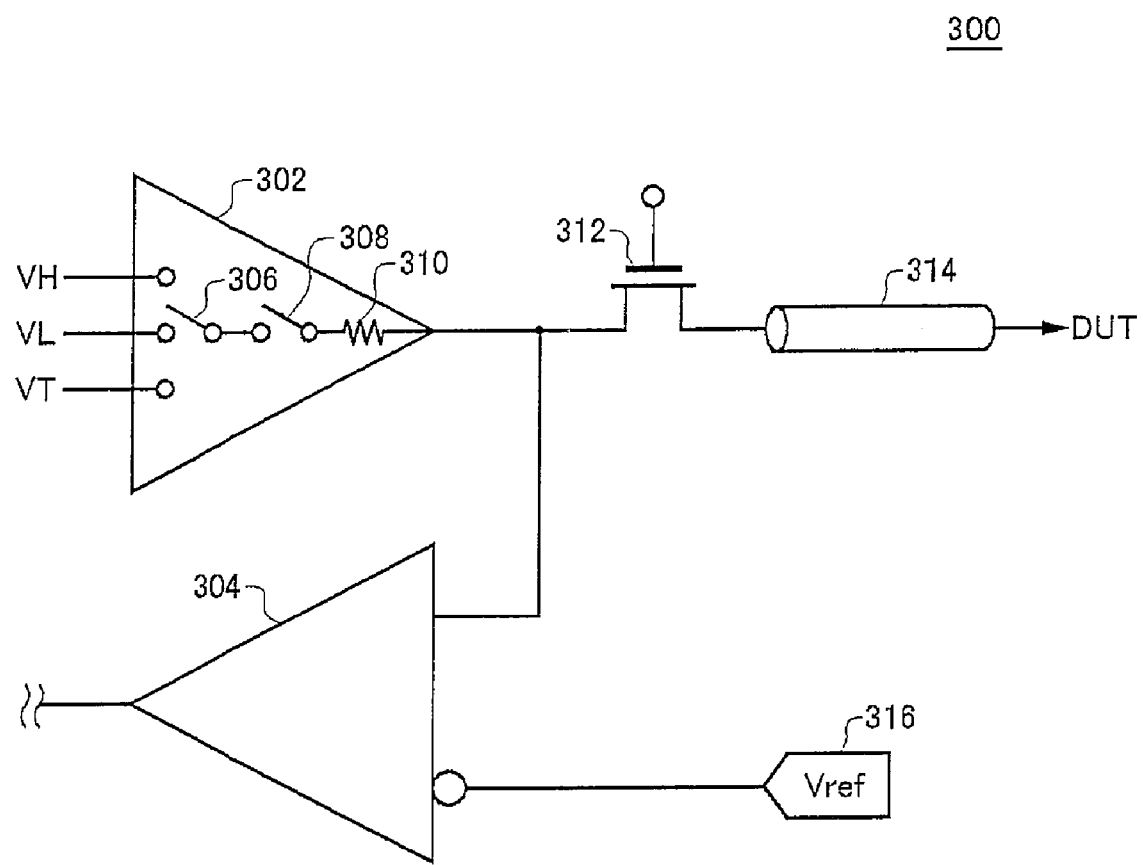
FIG. 4 illustrates an exemplary configuration of a conventional pin electronics card 300.

FIG. 3 illustrates, as an example, the equivalent circuit which is realized when the first FET switch 38 is turned on. While being turned on, the first FET switch 38 is represented by a resistance 44, a capacitance component 46 and a capacitance component 48. The resistance 44 is provided in series between the driver 24 and the transmission path 50. The capacitance component 46 is provided between one of the ends of the resistance 44 and the ground potential, and the capacitance component 48 is provided between the other end of the resistance 44 and the ground potential.

Referring to the equivalent circuit, the product of the resistance value and the capacitance value takes a constant value. In other words, the on-resistance is inversely proportional to the capacitance component in the first FET switch 38. Here, the output resistance 30 and the first FET switch 38 pass the test signal, which is input from the driver 24 into the device under test 200. Therefore, the on-resistance of the first FET switch 38 is preferably determined with reference to the frequency of the test signal.

While the embodiment of the present invention has been described, the technical scope of the invention is not limited to the above described embodiment. It is apparent to persons skilled in the art that various alterations and improvements can be added to the above-described embodiment. It is also apparent from the scope of the claims that the embodiments added with such alternations or improvements can be included in the technical scope of the invention.

As is apparent from the above, the embodiment of the present invention can reduce the degradation in accuracy of the voltage comparing operation of the comparator which is caused by the variation of the on-resistance of the FET switch, even when the FET switch has a high on-resistance in order to allow a test based on a high-frequency signal.

What is claimed is:

1. A test apparatus for testing a device under test, comprising:
    a driver that outputs a test signal to the device under test;
    a first switch that switches whether to connect the driver to the device under test;
    a comparator that receives an output signal from the device under test via the first switch, and compares a voltage of the output signal with a predetermined reference voltage;
    a reference voltage input section that inputs the reference voltage into the comparator;
    a second switch that is provided between the reference voltage input section and the comparator; and
    a dummy resistance that is connected at one end thereof to a connection point between the comparator and the second switch and at the other end thereof to a predetermined potential, wherein
    a resistance ratio between an output resistance of the driver and an on-resistance of the first switch is substantially equal to a resistance ratio between the dummy resistance and an on-resistance of the second switch.

2. The test apparatus as set forth in claim 1, wherein
    the driver, the first switch, the comparator, the second switch and the dummy resistance are provided on a same substrate.

3. The test apparatus as set froth in claim 2, wherein
    the on-resistance of the second switch is higher than the on-resistance of the first switch, and
    the dummy resistance is higher than the output resistance of the driver.

4. The test apparatus as set forth in claim 3, wherein
the driver has a first enabling switch that switches whether to connect an output end of the driver to a predetermined termination voltage or terminate the output end of the driver in a high-impedance manner, and
the test apparatus further comprises a second enabling switch that switches whether to connect the dummy resistance to the termination voltage or terminate the dummy resistance in a high-impedance manner.

5. The test apparatus as set forth in claim 4, wherein
when the first enabling switch connects the output end of the driver to the termination voltage, the second enabling switch connects the dummy resistance to the termination voltage, and
when the first enabling switch terminates the output end of the driver in a high-impedance manner, the second enabling switch terminates the dummy resistance in a high-impedance manner.

6. The test apparatus as set forth in claim 1, wherein
the first and second switches are FET switches.

7. A pin electronics card for use in a test apparatus that tests a device under test, the pin electronics card transmitting/receiving a signal to/from the device under test, the pin electronics card comprising:

a driver that outputs a test signal to the device under test;

a first switch that switches whether to connect the driver to the device under test;

a comparator that receives an output signal from the device under test via the first switch, and compares a voltage of the output signal with a predetermined reference voltage;

a reference voltage input section that inputs the reference voltage into the comparator;

a second switch that is provided between the reference voltage input section and the comparator; and a dummy resistance that is provided in parallel with the second switch when seen from the comparator, wherein a resistance ratio between an output resistance of the driver and an on-resistance of the first switch is substantially equal to a resistance ratio between the dummy resistance and an on-resistance of the second switch.

8. The pin electronics card as set forth in claim 7, wherein the first and second switches are FET switches.

* * * * *